(12) United States Patent
Watanabe et al.

(10) Patent No.: US 9,960,308 B2
(45) Date of Patent: May 1, 2018

(54) PHOTOELECTRIC CONVERSION ELEMENT

(71) Applicant: MICRO SIGNAL CO., LTD., Kyoto (JP)

(72) Inventors: Kunihiro Watanabe, Uji (JP); Masaya Okada, Takatsuki (JP); Kazunori Nohara, Otsu (JP)

(73) Assignee: MICRO SIGNAL CO., LTD., Kyoto (JP)

( * ) Notice: Subject to any disclaimer, the term of this patent is extended or adjusted under 35 U.S.C. 154(b) by 0 days. days.

(21) Appl. No.: 15/295,359

(22) Filed: Oct. 17, 2016

(65) Prior Publication Data

US 2017/0338366 A1 Nov. 23, 2017

(30) Foreign Application Priority Data

May 20, 2016 (JP) .................................. 2016-101452

(51) Int. Cl.
*H01L 31/06* (2012.01)
*H01L 31/103* (2006.01)
(Continued)

(52) U.S. Cl.
CPC ............ *H01L 31/103* (2013.01); *H01L 23/60* (2013.01); *H01L 31/02164* (2013.01); *H01L 31/022408* (2013.01)

(58) Field of Classification Search
CPC ......... H01L 27/14643; H01L 27/14665; H01L 31/10; H01L 21/22; H01L 21/38;
(Continued)

(56) References Cited

U.S. PATENT DOCUMENTS 5,130,776 A * 7/1992 Popovic ............ H01L 31/02019
257/461
6,150,704 A * 11/2000 Kozuka ............ H01L 27/14603
257/434

FOREIGN PATENT DOCUMENTS

JP S59-12034 B2 3/1984
JP H03-203273 A 9/1991
(Continued)

OTHER PUBLICATIONS

Jan. 23, 2018 Office Action issued in Japanese Patent Application No. 2015-086836.

*Primary Examiner* — Sonya D McCall Shepard
(74) *Attorney, Agent, or Firm* — Oliff PLC

(57) ABSTRACT

A number of micro-sized rectangular dot-like n-type semiconductor regions 121 are created in a p-type semiconductor region which is a base body 11. Contact parts 14, each of which is in contact with one n-type semiconductor region 121 and almost entirely covers the same region, are mutually connected by a wire part 15 as a common cathode terminal. The n-type semiconductor regions 121 receives no light; their function is to collect carriers generated within and outside the surrounding depletion layers. Appropriate setting of the spacing of the n-type semiconductor regions 121 enables efficient collection of the carriers generated in the p-type semiconductor region while improving the SN ratio of the photo-detection signal by a noise-reduction effect due to a decrease in the p-n junction capacitance. Carriers originating from light of shorter wavelengths are barely reflected in the photo-detection signal. Thus, unfavorable influences of the shorter wavelengths of light are eliminated.

19 Claims, 8 Drawing Sheets

(51) Int. Cl.
*H01L 23/60* (2006.01)
*H01L 31/0224* (2006.01)
*H01L 31/0216* (2014.01)

(58) Field of Classification Search
CPC ....... H01L 33/50; H01L 33/58; H01L 31/068;
H01L 31/072; H01L 31/103; H01L
31/109; H01L 31/1124; H01L 31/1127;
H01L 31/118
See application file for complete search history.

(56) References Cited

FOREIGN PATENT DOCUMENTS

| | | |
|---|---|---|
| JP | H05-145055 A | 6/1993 |
| JP | H11-112006 A | 4/1999 |
| JP | H11-312823 A | 11/1999 |
| JP | 2006-351787 A | 12/2006 |
| JP | 2008-117952 A | 5/2008 |
| JP | 2010-102387 A | 5/2010 |
| JP | 2015-056651 A | 3/2015 |
| WO | 2012/046628 A1 | 4/2012 |

\* cited by examiner

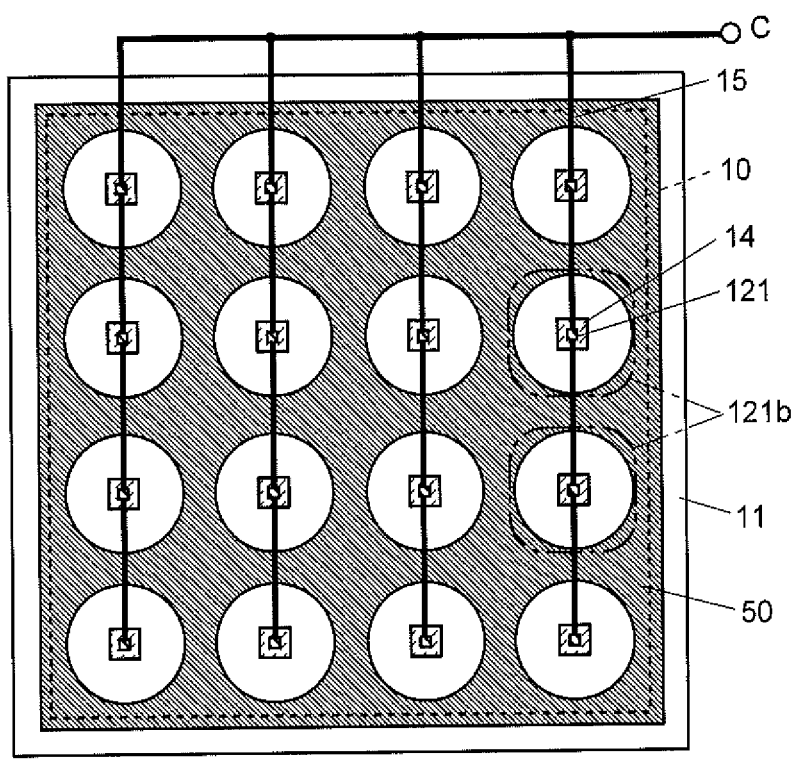

PHOTOELECTRIC CONVERSION ELEMENT

TECHNICAL FIELD

The present invention relates to a photoelectric conversion element for receiving light and converting it into electric signals. The term "photoelectric conversion element" in the present description includes photodiodes, phototransistors, photodarlington transistors, photothyristors, phototriacs and other similar elements. The photoelectric conversion element may be constructed in the form of an independent element, or it may be a portion of an integrated circuit (IC) or large scale integrated circuit (LSI) in which various other functions are provided.

BACKGROUND ART

A photodiode normally includes an n-type semiconductor region and a p-type semiconductor region formed by selectively diffusing an impurity (e.g. boron) into the n-type semiconductor region. The p-type semiconductor region and n-type semiconductor region form a p-n junction. When light of an appropriate intensity arrives at the photodiode, electron-hole pairs are generated throughout the whole body of the photodiode, i.e. in the depletion layer near the junction of the p-type and n-type semiconductor regions, in the p-type semiconductor region, and in the n-type semiconductor region. Normally, in the depletion layer, electrons and holes are accelerated toward the n-type semiconductor region and the p-type semiconductor region, respectively, due to the effect of an electric field, Among the electron-hole pairs generated in the n-type semiconductor region, the electrons remain within the n-type semiconductor region along with the electrons transferred from the n-type semiconductor region, while the holes diffuse within the n-type semiconductor region to the depletion layer. Upon reaching the depletion layer, the holes are accelerated by the electric field and gathered into the p-type semiconductor region. In this manner, holes and electrons are collected in the p-type and n-type semiconductor regions, respectively, and flow through an externally connected load as a photocurrent.

Even when the conductivity types of the semiconductors are opposite to the previously described ones, the construction and operation of the device are basically the same.

In commonly used photodiodes, the p-type semiconductor region formed by the selective diffusion almost entirely covers the light-receiving area which receives incident light, so as to allow the light to reach the entire junction between the p-type and n-type semiconductor regions. FIG. 15A is a schematic sectional view of a typical photodiode, and FIG. 15B is its top-side plan view. In the present example, the base body 11 itself serves as the n-type semiconductor region, with the p-type semiconductor region 12 formed by selective diffusion across almost the same range as the light-receiving area 10 on the surface of the base body 11. The contact part 13, which consists of a conductor formed in contact with the base body 11, is the cathode terminal (C), while the contact part 14, which consists of a conductor formed in contact with the p-type semiconductor region 12, is the anode terminal (A).

In order to achieve a high level of photo-detection sensitivity in such a photodiode, the light-receiving area 10 should preferably have a large area. If the light-receiving area 10 is enlarged, the p-type semiconductor region 12 also needs to be enlarged due to the previously described reason. However, increasing the area of the p-type semiconductor region 12 causes an increase in the junction capacitance, which in turn increases the level of noise in such elements as the amplifier connected for the conversion of the photocurrent produced by the photodiode into voltage. Consequently, the SN ratio of the photo-detection signal becomes lower, which makes it necessary to reduce the frequency bandwidth of the amplifier or decrease its gain.

In other words, to reduce a high-frequency noise in a photodiode, the junction capacitance needs to be lowered (for example, see Patent Literature 1). However, if the area of the p-type semiconductor region formed by selective diffusion is decreased in order to lower the junction capacitance, the photo-detection sensitivity may possibly be lowered.

In order to lower the junction capacitance of the p-n junction, in a conventional photodiode described in Patent Literature 2, a structure is adopted in which a plurality of island-like p-type diffusion layers are formed on the surface of an n-type substrate, and the same number of electrodes as the island-like diffusion layers are provided in a mutually connected form. The spacing of the island-like p-type diffusion layers is made to be equal to or smaller than the distance over which the minority carriers diffuse ("minority carrier diffusion length"). In Patent Literature 2, it is claimed that such a structure provides the photodiode with a larger light-receiving range which effectively works in both horizontal and vertical directions from each p-type diffusion layer, and the photocurrent corresponding to the incident light can also be obtained in the regions between the p-type diffusion layers ("no-diffusion-layer regions"), so that the photo-detection sensitivity barely deteriorates as compared to the case where the same diffusion layer is formed across the regions between the island-like p-type diffusion layers. It is also claimed that the junction capacitance becomes lower since the area of the p-n junction is decreased by an amount corresponding to the no-diffusion-layer regions.

CITATION LIST

Patent Literature

Patent Literature 1: JP 11-312823 A (paragraph [0020])
Patent Literature 2: JP 59-12034 B
Patent Literature 3: JP 2010-102387 A

SUMMARY OF INVENTION

Technical Problem

Actually, due partly to the large area of the diffusion region, the structure of the element described in Patent Literature 2 does not significantly decrease the junction capacitance. The improvement of the performance due to the lowered junction capacitance is also less than expected. Accordingly, a photoelectric conversion element which has a novel structure capable of achieving an even greater decrease in the p-n junction capacitance while preventing the deterioration in the photo-detection sensitivity has been demanded. For example, in a photoelectric switch which uses modulated light in order to lower susceptibility to the ambient light, when the modulation frequency is set at a high value, it is important to lower the p-n junction capacitance and thereby achieve the highest possible SN ratio. Accordingly, for a photoelectric conversion element which is used as a photodetector or similar element in a photoelectric switch, it is particularly important to lower the p-n junction capacitance.

In a photodiode having a commonly used structure, the wavelength-sensitivity characteristics can be controlled to a certain extent through the thickness of the diffusion layer, concentration of the impurity or other parameters. However, a significant adjustment of the sensitivity is difficult. Therefore, for example, as in the case of an optical measurement under a high amount of ultraviolet light, when it is necessary to reduce the influence of light at short wavelengths, an optical filter for blocking light within an unwanted wavelength range is normally used with the photodiode. However, integrating such an optical filter with the photo diode into one unit requires an additional manufacturing process, whereas using a separate optical filter along with the photodiode increases the number of parts. In any case, the manufacturing cost dramatically increases. Accordingly, a photodiode or other types of photoelectric conversion elements which can block light at short wavelengths without using an additional structural component have been demanded.

The present invention has been developed in view of such problems. Its primary objective is to provide a photoelectric conversion element in which the junction capacitance of a p-n junction (or other kinds of junctions) can be lower than the conventional level, while preventing a decrease in the photo-detection sensitivity, so as to reduce the level of noise which depends on the junction capacitance and thereby improve the SN ratio of the photo-detection signal.

Another objective of the present invention is to provide a photoelectric conversion element provided with an easy-to-realize structural device which can effectively block light at shorter wavelengths within the wavelength range of the spectral sensitivity obtained by the photoelectric conversion portion while securing a high level of photo-detection sensitivity at longer wavelengths of light.

Solution to Problem

The photoelectric conversion element according to the present invention developed for solving the previously described problem includes:

a) a first region of a first conductivity type, the first region being either a semiconductor base body itself or a region which is formed in the semiconductor base body and is different from the semiconductor base body;

b) a point-like second region of a second conductivity type different from the first conductivity type, the second region formed by diffusing an impurity or growing an epitaxial layer on a surface of the first region within a light-receiving range; and c) a light-blocking part for blocking light incident on the second region among the light incident on the light-receiving range on an entrance surface which receives light from outside, where the second region produces a photo-detection signal by collecting, from a surrounding area, carriers generated in the first region by the light incident on the light-receiving range.

The photoelectric conversion element according to the present invention may preferably include a plurality of the second regions arranged in a mutually separated form within the light-receiving range for obtaining a single photo-detection signal, with the plurality of the second regions mutually connected so as to total photo-detection signals produced by the individual second regions.

Examples of the photoelectric conversion element according to the present invention include photodiodes, phototransistors, photodarlington transistors, photothyristors, photo triacs and other similar elements. The photoelectric conversion element according to the present invention may be constructed in the form of an independent element, or it may be a component in a larger device (such as a photodiode array in which a plurality of photodiodes are arranged) or a portion of an IC or LSI in which various other functions are provided.

In the photoelectric conversion element according to the present invention, either the combination of n-type as the first conductivity type and p-type as the second conductivity type, or conversely, p-type as the first conductivity type and n-type as the second conductivity type is possible.

In the conventionally and commonly used photoelectric conversion elements, inclusive of the one described in Patent Literature 2, not only the first region but also the second region formed within the light-receiving range by the diffusion of an impurity have the function of producing carriers in response to incidence of light. By comparison, in the photoelectric conversion element according to the present invention, the micro-sized second regions are shielded from the light by the light-blocking part and do not essentially contribute to the photoelectric conversion. Their primary function is to collect the carriers generated by the photoelectric conversion in the surrounding area, i.e. in the first region. That is to say, when carriers are generated by an incidence of light on the first region, the carriers move by drift in the depletion layer formed around the second region, or by diffusion in the first region outside the depletion layer. The second region collects the carriers which arrive in this region after being generated in the surrounding areas. Thus, the carriers are reflected in the photocurrent. Since the second region only needs to be capable of collecting the carriers coming from the surrounding areas, its area can be considerably decreased, whereby the junction capacitance at one second region will be considerably low.

Light of a longer wavelength penetrates into a deeper portion in the first region and generates carriers in that region. Conversely, light of a shorter wavelength generates carriers in a near-surface area of the first region. The carriers generated in the near-surface area easily reach the surface during their self-diffusing movement and undergo surface recombination, causing a considerable loss of the photocurrent. Therefore, the carriers generated by the light with longer wavelengths are more likely to reach the second region, while those generated by the light with shorter wavelengths are less likely to reach the second region. In the photoelectric conversion element according to the present invention, the generation of the carriers in the second region is almost completely prevented by shielding the second region from light by the light-blocking part. Therefore, the carriers which would usually be generated in the second region due to the shorter wavelengths of light are practically negligible. Consequently, the photo-detection sensitivity to the light of shorter wavelengths, or specifically, to the light of 400-450 nm or shorter wavelengths, is lowered without decreasing the photo-detection sensitivity to the light of longer wavelengths. In other words, the influence of the ultraviolet light having shorter wavelengths is reduced, so that the light of interest can be sensitively detected.

The point-like second region in the photoelectric conversion element according to the present invention has an adequately smaller size than the diffusion region in the conventional photoelectric conversion element of this type. For example, it is a region whose area is equal to or smaller than 1% of the entire light-receiving range and can be regarded as a point as compared to the entire light-receiving range. More specifically, in the case of a photodiode used in a photoelectric switch (which normally has a light-receiving area of approximately 10,000 μm² to 1,000,000 μm²), the area of the second region should preferably be equal to or smaller than 100 μm² (equal to or smaller than the 10-μm square if the region has a square shape), or more preferably, equal to or smaller than 25 μm² (equal to or smaller than the 5-μm square if the region has a square shape).

However, in the case where a plurality of second regions are arranged within the light-receiving range, even when the area of each second region is small, the total area of the second regions (the sum of the areas of the individual second regions) per one light-receiving range increases with the number of second regions. The larger their total area is, the smaller the area which effectively contributes to the photoelectric conversion becomes, and the higher the junction capacitance in the light-receiving range becomes.

Accordingly, in the photoelectric conversion element according to the present invention, as one target, the total area of the plurality of second regions within the light-receiving range should preferably be equal to or lower than 5% of the area of the light-receiving range.

That is to say, as one preferable mode of the photoelectric conversion element according to the present invention, the second region having a small size as just mentioned may preferably be arranged, for example, in the form of a large number of dots at an appropriate distribution density on the surface of the first region within the light-receiving range, with the total area of the large number of second regions being equal to or lower than approximately 5% of the area of the light-receiving range, or more preferably, equal to or lower than approximately 1%. That is to say, in the case of the aforementioned photodiode used in a photoelectric switch the total area of the second regions should preferably be equal to or smaller than approximately 500 μm² to 50,000 μm².

With this configuration, it is possible to lower the junction capacitance of the junction between the first and second regions in the light-receiving range so as to reduce the level of noise which depends on the junction capacitance, while efficiently collecting the carriers generated in the first region by the light arriving at the light-receiving range to obtain an adequate level of signal intensity. Consequently, the SN ratio of the signal will be improved.

Among the previously described modes of the transfer of the carriers, the transfer of the carriers by diffusion occurs in various directions, while that of the carriers by drift is directed toward the second region. Therefore, the latter mode provides a higher level of carrier-collecting efficiency. Accordingly, in order to maximize the signal intensity corresponding to the amount of the received light, it is preferable to reduce the spacing between the depletion layers formed around the second regions. To this end, the spacing of the neighboring second regions must not be too large. Taking this into account, the distribution density of the plurality of second regions or the number of second regions per unit area may preferably be determined in addition to the percentage of the total area of the second regions in the light-receiving area.

In the aforementioned Patent Literature 2, it is argued that the junction capacitance of the p-n junction depends on the area of the p-type diffusion region in the n-type region. Actually, the electrostatic capacitance of a junction (which is typically a p-n junction) between a first region and an island-like second region formed in the first region is expressed as a function of not only the area of the second region but also the circumferential length of the second region, depth of the depletion layer and other parameters.

The depth of the depletion layer depends on the impurity concentration in the first and second regions as well as on the bias (reverse-bias) voltage applied between the two regions. Therefore, it is possible to consider that the junction capacitance depends on the area of the second region and the circumferential length of the second region under the condition that the impurity concentration and the reverse-bias voltage are the same (for example, see Patent Literature 3).

Accordingly, as one mode of the photoelectric conversion element according to the present invention, the number of the second regions as well as the area and circumferential length of each second region should preferably be determined so that the sum of the junction capacitances of the junctions between the first region and the plurality of second regions becomes smaller than a junction capacitance which will be observed at the junction between the first region and the second region if the second region is formed over the entire light-receiving range. A special attention should be paid to the fact that providing a large number of second regions makes the junction capacitance significantly affected by the circumferential length per one second region.

This configuration makes it possible to assuredly make the junction capacitance of the p-n junction lower than the junction capacitance of the conventionally and commonly photoelectric conversion elements. Consequently, the level of noise which depends on the junction capacitance is reduced, and the SN ratio of the photo-detection signal is improved.

The photoelectric conversion element according to the present invention may further include:

a plurality of contact parts respectively provided above the plurality of second regions, with each contact part electrically connected to the second region located below; and a wire part which is an electric conductor for connecting the plurality of contact parts with each other so as to connect the plurality of second regions within the light-receiving range in parallel, where all of the second regions within the light-receiving range are located directly below either the contact parts and/or the wire part so as to make the contact parts and/or the wire part function as the light-blocking part.

In a common semiconductor process, the second region is formed by the diffusion of an impurity, and therefore, is slightly expanded beyond the range where the impurity is injected. On the other hand, the contact part is formed slightly inside the junction boundary in order to avoid a short circuit with the first region. Due to such design factors, the outer edge of the second region comes slightly outside the outer edge of the contact part even when the contact part and the wire part are formed so as to cover the second region from above. Even in that case, the contact part can satisfactorily function as the light-blocking part.

According to this configuration, at least one of the contact parts and the wire part for connecting the plurality of second regions with each other can be used as the light-blocking part. Therefore, no special manufacturing process for providing the light-blocking part is required.

In the photoelectric conversion element according to the present invention, the wire part located above a depletion-layer-spread region formed in the first region surrounding the second region should preferably have a smaller linewidth than the contact part and the wire part located above the second region.

It is inevitable that at least a portion of the wire part connecting the contact parts traverses the first region. However, in the above configuration, the percentage of the light blocked by the wire part is considerably low, or almost negligible, so that a greater amount of photocurrent can be obtained.

Basically, the second region may have any shape as viewed from above, example for a square shape, a rectangular shape, a polygonal shape, an elliptical shape, and a circular shape. However, provided the region has the same area, a shape with a shorter circumferential length is more advantageous for decreasing the junction capacitance. Therefore, the second region as viewed from above should preferably have an approximately square shape rather than a rectangular shape, more preferably a polygonal shape, and ideally a circular shape.

In the case where the plurality of second regions are arranged in the form of dots in the previously described manner, the second regions may be arranged at the intersection points of a rectangular lattice, or this arrangement may be modified so that the position of the second regions in every other row or column is shifted by one half of the spacing of the second regions along the extending direction of the row or column.

As compared to the arrangement with the second regions located at the intersection points of a rectangular lattice, the latter configuration requires a smaller number of second regions to be arranged under the condition that any point inside the light-receiving area has the nearest second region within a specific distance. As a result, the junction capacitance of the junction will be even more reduced while the photo-detection sensitivity is maintained at approximately the same level.

Furthermore, in the case where a large number of second regions are created in the form of dots in the previously described manner, it is preferable to arrange a plurality of second regions on straight lines and connect the plurality of second regions on each of the straight lines by the wire part having a linear shape, where the spacing of the plurality of second regions in the extending direction of the wire part is smaller than the spacing of the plurality of second regions in the direction orthogonal to the extending direction of the wire part. This configuration allows the wire parts to be arranged with a larger spacing under the condition that any point within the light-receiving area has the nearest second region within a specific distance, so that the percentage of the light blocked by the wire parts will be low. Consequently, a larger amount of light will be received and the signal intensity will be increased.

In the photoelectric conversion element according to the present invention, a high-concentration region having a predetermined shape, for example, a dot-like shape and linear shape, as viewed from above may be formed outside the depletion-layer region located between the plurality of second regions discretely arranged in the first region, the high-concentration region having a higher concentration of the impurity of the first conductivity type than the surrounding first region. The diffusion of this high-concentration region can be achieved not only by diffusion from the surface but also by implant-type diffusion.

This configuration creates an impurity-concentration gradient within the first region from the position of the high-concentration region toward the second region, whereby a potential gradient for promoting the carrier transfer is formed. Consequently, the carriers are more efficiently transferred into the second region, so that a higher photo-detection sensitivity as well as a higher operation speed will be achieved.

In the photoelectric conversion element according to the present invention, as already explained, the area of each second region should be as small as possible from the point of view of the junction capacitance, under the condition that some specific requirements, such as the secure and reliable electric connection with the contact part, are satisfied. On the other hand, the spacing between the neighboring second regions should preferably be equal to or smaller than the width of the drift region where the carriers generated by an incidence of light within the first region can move by drift, and also equal to or smaller than the distance within which the carriers can reach the second regions with an adequately high level of efficiency (i.e. within which the decrease in the photo-detection sensitivity is sufficiently small).

However, it is difficult to increase the moving speed of the carriers by diffusion within the first region outside the depletion layer to a level comparable to the moving speed of the carriers by drift within the depletion layer. Accordingly, when high-speed operation is particularly important, the second regions should preferably be arranged so that no gap is left between the depletion-layer-spread regions formed around the second regions. By this configuration, almost all carriers generated in response to the incident light can reach the second regions by drift, so that a high response speed can be achieved. The carrier-collection efficiency will also be improved. Needless to say, even in this case, the spacing between the second regions should preferably be as large as possible in order to reduce the junction capacitance of the entire light-receiving range. Accordingly, as one mode of the photoelectric conversion element according to the present invention, it is preferable to arrange the plurality of second regions at the intersection points of a honeycomb pattern as viewed from above, in order to arrange the second regions without leaving any gap between the depletion-layer-spread regions while minimizing the overlapping area of the depletion-layer-spread regions.

To simultaneously realize both a high-speed response and a large area of the light-receiving range, the plurality of second regions may preferably be arranged separately from each other so as to avoid overlapping of the depletion-layer-spread regions formed in the first region around the respective second regions, and a light-blocking part for blocking an incidence of light may be provided over a portion or the entirety of the area outside the depletion-layer-spread region around each second region within a light-receiving range.

By this configuration, even if the light-receiving range has a large area, almost all carriers responding to the incident light are generated within the depletion-layer-spread region around each second region. Therefore, the carriers quickly reach the second regions, whereby a high-speed response is achieved. Additionally, even if the light-receiving range has a large area, the total number of the second regions can be comparatively small, so that the junction capacitance can also be comparatively low. On the other hand, the large area of the light-receiving range enables an efficient reception of the incident light arriving at a wide range as well as a secure reception of the incident light arriving at various positions within a wide range. This increases the permissible range for the adjustment of the optical axis of the incident light.

In the case where the second regions are created in the form of dots, the wire part connecting the second regions with each other is inevitably provided within the light-receiving area. If electromagnetic noise enters this wire part, the noise level of the photo-detection signal will be significantly increased.

Accordingly, the photoelectric conversion element according to the present invention may preferably further include:

an insulating film formed so as to cover the contact part and the wire part; and a conductor part provided on the insulating film above the contact part and the wire part, where a predetermined fixed electric potential is given to the conductor part so as to make the conductor part function as an electric shield.

By this configuration, the conductor part produces the electromagnetic shielding effect for preventing external noise from entering the wire part in the lower layer, whereby the influence of the external noise on the photo-detection signal is reduced.

In the photoelectric conversion element according to the present invention, it is more preferable to form a plurality of conductive pillar-shaped parts extending from the conductor part located above the wire part into the insulating film sandwiched between the conductor part and the wire part, in such a manner as to surround the lateral sides of the wire part, or to form conductive linear parts extending substantially parallel to the wire part in such a manner as to be placed on both sides of the wire part, and to make the pillar-shaped parts or the linear parts function as an electric shield in conjunction with the conductor part.

According to this configuration, not only the conductor part has an electromagnetic shielding effect; the plurality of pillar-shaped parts or linear parts located on the lateral sides of the wire part also have an electromagnetic shielding effect. Therefore, noise signals which obliquely fall onto the wire part can also be blocked, whereby an even higher level of electromagnetic shielding effect is achieved.

It is also possible to provide conductor parts above and below at least a portion of the wire part, with an insulating film between the wire part and each of the upper and lower conductor parts, and to form, as the pillar-shaped parts, a plurality of vias connecting the upper and lower conductor parts.

As already explained, if the total area of the second regions is enough smaller than the area of the light-receiving region, the primary effect that the level of noise which depends on the junction capacitance is reduced can be achieved without the light-blocking part.

Accordingly, the photoelectric conversion element according to the second present invention developed for solving the previously described problem includes:

a) a first region of a first conductivity type, the first region being either a semiconductor base body itself or a region which is formed in the semiconductor base body and is different from the semiconductor base body; and b) a plurality of the point-like second regions of a second conductivity type different from the first conductivity type arranged in a mutually separated form within the light-receiving range for obtaining a single photo-detection signal, with the plurality of the second regions mutually connected so as to total photo-detection signals produced by the individual second regions, the second region formed by diffusing an impurity or growing an epitaxial layer on a surface of the first region within a light-receiving range, where the second region produces a photo-detection signal by collecting, from a surrounding area, carriers generated in the first region by the light incident on the light-receiving range.

Advantageous Effects of the Invention

In the photoelectric conversion element according to the present invention, the junction capacitance of the junction for the photoelectric conversion is decreased, whereby the high-frequency noise which depends on the junction capacitance is reduced, and the SN ratio of the photo-detection signal is improved. Furthermore, in the photoelectric conversion element according to the present invention, the area of the selective diffusion for forming the second regions is smaller than in the conventional devices. Therefore, for example, the p-n junction area is also smaller, so that a property deterioration or failure due to crystal defects or other factors is less likely to occur.

In the photoelectric conversion element according to the present invention, the second regions are shielded from light by the light-blocking part, such as the contact part or wire part. Therefore, it is possible to achieve both a decrease in the junction capacitance of the junction for the photoelectric conversion and a simple structure for realizing a photo-detection sensitivity characteristic with a lowered sensitivity to light at short wavelengths. Therefore, for example, even when the photoelectric conversion element is used under the condition that there is a considerable amount of ultraviolet light as noise components, the influence of that noise will be reduced and the photo-detection signal will be obtained with high SN ratios. Since the light-blocking part is formed by a normal manufacturing process for photoelectric conversion elements, the aforementioned effects can be obtained without particularly increasing the device cost.

BRIEF DESCRIPTION OF DRAWINGS

FIG. 9 is a top-side plan view of a photodiode as still another variation.

DESCRIPTION OF EMBODIMENTS

Embodiments of the photoelectric conversion element according to the present invention are hereinafter described with reference to the attached drawings.

First Embodiment

Figure 1A:
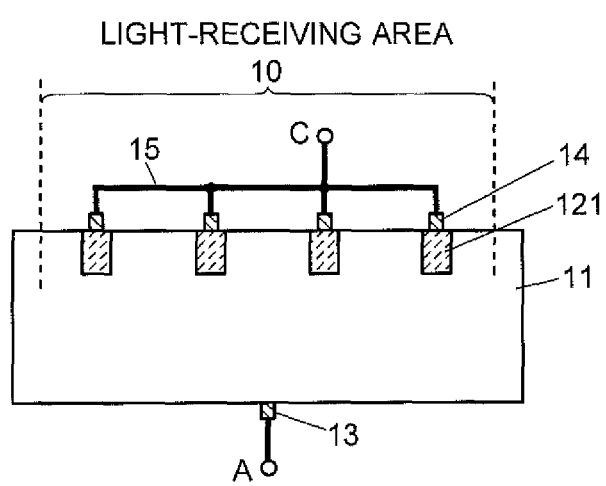
FIGS. 1A, 1B and 1C are respectively a schematic sectional view, top-side plan view, and equivalent circuit diagram of a photodiode as one embodiment of the photoelectric conversion element according to the present invention.
Figure 1B:
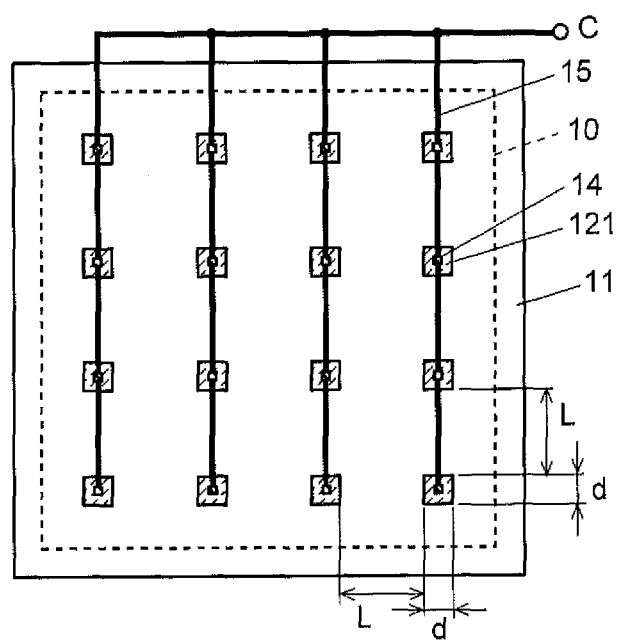
Figure 1C:
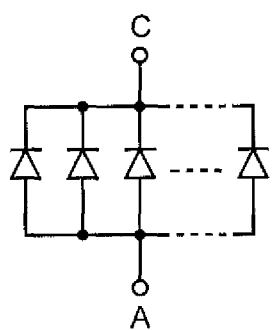
Figure 2:
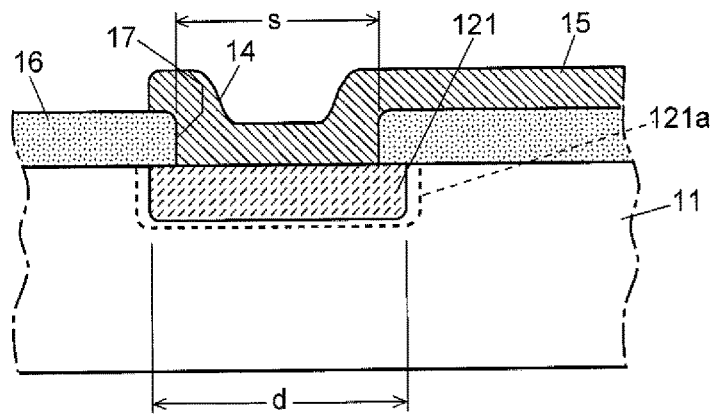
FIG. 2 is an enlarged sectional view of an area around one n-type semiconductor region in the photodiode of the present embodiment.
Figure 3A:
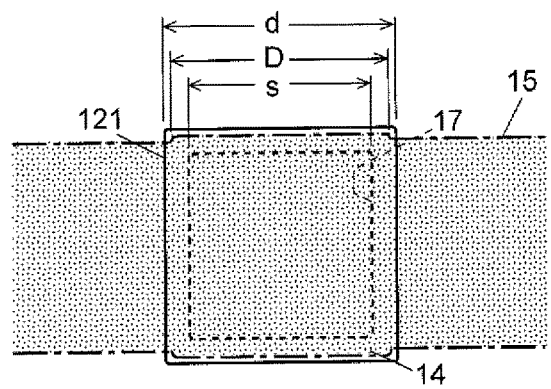
FIGS. 3A and 3B are enlarged top-side plan views of an area around one n-type semiconductor region in the photodiode of the present embodiment.
Figure 3B:
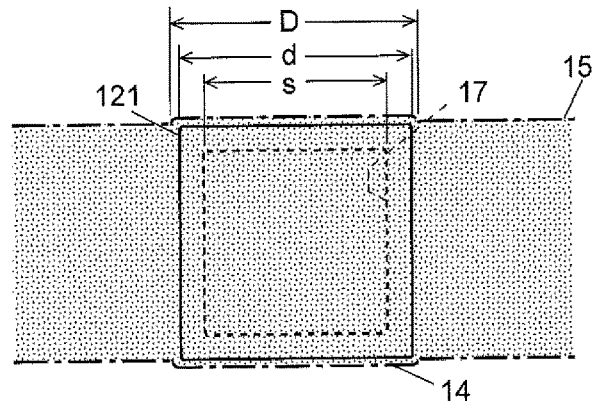

FIG. 1A is a schematic sectional view of a photodiode as one embodiment of the photoelectric conversion element according to the present invention, FIG. 1B is a top-side plan view, and FIG. 1C is an equivalent circuit diagram. FIG. 2 is an enlarged sectional view of an area around one n-type semiconductor region in the photodiode of the first embodiment. FIGS. 3A and 3B are enlarged top-side plan views of an area around one n-type semiconductor region in the photodiode of the first embodiment.

As shown in FIG. 1B, the photodiode in the present embodiment includes a base body 11 (which corresponds to the "first region" in the present invention) made of a p-type silicon (Si) semiconductor and a plurality of (in the present example, 16) n-type semiconductor regions 121 created in the form of mutually separated dots within one light-receiving area 10 on the surface (in FIG. 1A, on the top surface) of the base body 11. Each n-type semiconductor region 121 is a micro-sized n-type semiconductor diffusion layer having a rectangular shape as viewed from above. The n-type semiconductor regions 121 are formed by selective diffusion of an impurity, such as phosphorus or by epitaxial growth.

In the present embodiment, one n-type semiconductor area 121 has a square shape as viewed from above with a size of d×d. The spacing between the neighboring n-type semiconductor regions 121 is L. For example, the one-side length d of the n-type semiconductor regions 121 is 1 μm, and the spacing L of the n-type semiconductor regions 121 is 5-20 times as large as d, i.e. approximately 5-20 μm. In terms of the area within the light-receiving area 10, one n-type semiconductor region 121 having an area of approximately 1 μm² is provided per 25-400 μm² of the light-receiving surface. That is to say, the percentage of the sum of the areas of all n-type semiconductor regions 121 arranged in the form of dots within one light-receiving area 10 is considerably low, which is not higher than 5% of the area of the light-receiving area 10.

The n-type semiconductor regions 121 are regularly arranged at the intersection points of a rectangular lattice as viewed from above. For each n-type conductor region 121, a contact part 14 made of a metal or different kind of conductor is formed in contact with the n-type conductor region. Specifically, as shown in FIG. 2, an insulating film 16 made of $SiO_2$ (or other materials) is formed so as to cover the surface of the base body 11 (which is the p-type semiconductor) and the n-type semiconductor area 121. A portion of the insulating film 16 above the n-type semiconductor region 121 is removed by etching (or other methods) to form a contact hole (or via hole) 17. The contact hole 17 (which has an s×s square shape in FIGS. 2 and 3) is slightly smaller in size than the n-type semiconductor region 121. Through this contact hole 17, the contact part 14 is formed in contact with the n-type semiconductor region 121. In the present embodiment, the contact part 14 has a rectangular shape whose size is approximately the same as or slightly larger than the boundary line of the n-type semiconductor region 121 located below. In other words, the size of one contact part 14 is also approximately d×d.

When the n-type semiconductor region 121 is formed by impurity diffusion, the diffusion region often becomes slightly expanded beyond the intended boundary line in the manufacturing process. In FIG. 2, such an n-type semiconductor region formed by a slightly expanded diffusion is denoted by numeral 121a. This n-type semiconductor region 121a has a size of D×D (where D>d). In this manner, the position of the boundary line of the n-type semiconductor region varies to a certain extent. Therefore, if all contact parts 14 are formed in the same size, a situation may occur in which one contact part 14 covers the entire n-type semiconductor region 121, as shown in FIG. 3B, while another contact part 14 leaves the circumferential edge of the n-type semiconductor region 121 partially uncovered, as shown in FIG. 3A.

The contact parts 14, which are created for all n-type semiconductor regions 121 within the light-receiving area 10, are connected with each other by a wire part 15 made of a metal or different kind of conductor, which is formed simultaneously with the contact parts 14. This wire part 15 serves as the cathode terminal (C) of the photodiode. On the other hand, the common contact part 13, which is formed in contact with the base body 11, serves as the anode terminal (A) of the photodiode. As shown in FIGS. 3A and 3B, the wire part 15 in the present embodiment has a width equal to the one-side length of the contact part 14, although this is not essential.

The photodiode of the present embodiment having such a configuration can be considered to be equivalent to a circuit in which the same number of micro-sized photodiodes as the n-type semiconductor regions 121 are connected in parallel, as shown in FIG. 1C.

The junction capacitance due to one n-type semiconductor region 121 depends on the contact area between the n-type semiconductor region 121 (which roughly has a flat rectangular shape) and the surrounding p-type semiconductor base body 11. Since the depth of the n-type semiconductor region 121 is almost uniform, the junction capacitance can be calculated as a function of the area and circumferential length of the n-type semiconductor region 121, under the condition that the ambient temperature, reverse-bias voltage and other relevant conditions are the same. Thus, in the present case, the junction capacitance C is expressed as:

$$C \propto A \times [\text{area of } n\text{-type semiconductor region 121}] + B \times [\text{circumferential length of } n\text{-type semiconductor region 121}] \quad (1)$$

where A and B are specific constants.

The values of constants A and B vary depending on the impurity concentration distribution, diffusion depth and other values related to the diffusion layer. For example, in the case of the base body 11 made of a p-type semiconductor with the impurity diffused at a uniform concentration of approximately $1 \times 10^{14}$ atoms/cm³ to a depth of approximately 2 μm, the ratio of A to B is approximately from 0.5 to 2. In the case a dot-like diffusion region whose circumferential length value is larger than its area value, the percentage of the component capacitance proportional to the circumferential length in the junction capacitance increases with an increase in the number of diffusion regions.

The junction capacitance of the photodiode in the present embodiment is equal to the sum of the junction capacitances of the large number of micro-sized photodiodes connected in parallel. Accordingly, by increasing the spacing L between the neighboring n-type semiconductor areas 121 so as to decrease the number of n-type semiconductor regions 121 included in the light-receiving area 10 while decreasing the one-side length d of each n-type semiconductor region 121, it is possible to make the sum of the junction capacitances smaller than the junction capacitance of the conventional photodiode. Therefore, in the present example, the one-side length d of the n-type semiconductor region 121 is set at 1 µm and the spacing L is set at 5-20 µm. These values yield the junction capacitance lower than that of the conventional photodiode. As a result, the peaking of the gain on the frequency characteristics of an amplifier connected to the output side of the photodiode according to the present embodiment is prevented, and the high-frequency noise in the amplifier is thereby reduced, so that the bandwidth can be widened.

As compared to the conventional photodiode, the photodiode in the present embodiment has a smaller area of the n-type semiconductor regions 121 for the same area of the light-receiving area 10, which results in a smaller area of the depletion-layer regions formed around the n-type semiconductor regions 121. Although carriers can also be generated within the p-type semiconductor regions forming the base body 11 outside the depletion-layer regions, the photoelectric conversion efficiency in that region is lower than in the depletion-layer-spread region. Furthermore, the wire part 15 formed on the p-type semiconductor region blocks a small yet certain amount of incident light and thereby decreases the amount of light that can contribute to the photoelectric conversion. Due to these factors, the photo-detection signal will inevitably be lower than in the conventional photodiode. However, in the photodiode of the present embodiment, since the extent of the reduction in the high-frequency noise achieved by decreasing the junction capacitance is greater than the extent of the decrease in the photo-detection signal, the SN ratio of the photo-detection signal will be higher than in the conventional case.

In commonly used photodiodes, the p-n junction plane where the n-type semiconductor region is in contact with the p-type semiconductor region is almost horizontally formed inside the base body. The light penetrating into the base body reaches this p-n junction plane and generates carriers. By comparison, in the photodiode of the present embodiment, as is evident from in FIG. 2, the light barely reaches the p-n junction plane, since the area above the p-n junction plane inside the base body 11 is almost entirely covered with the contact part 14. Therefore, it is possible to infer that the carriers contributing to the photocurrent in the photodiode of the present embodiment are mostly generated inside the base body 11 made of the p-type semiconductor, and barely generated inside the n-type semiconductor region 121 or at the p-n junction plane. From this fact, it is possible to consider that the micro-sized n-type semiconductor regions 121 discretely arranged in the form of dots within the light-receiving area 10 in the photodiode of the present embodiment specifically function as a collector of the carriers generated in the surrounding areas (the depletion-layer-spread region and its surrounding areas) rather than a carrier generator.

In the photodiode of the present embodiment, the area above the n-type semiconductor region 121 is almost entirely covered with the contact part 14. This produces the following effect: The contact part 14, which is made of a metal or different kind of non-transparent conductor, has the function of blocking light. Therefore, within the light-receiving area 10, the light barely falls onto the n-type semiconductor regions 121; only the base body 11 receives light. Therefore, when light is incident on the light-receiving area 10, the carriers are barely generated in the n-type semiconductor regions 121; most of the carriers to be reflected in the photocurrent are generated inside the base body 11.

As is commonly known, light of a longer wavelength penetrates into a deeper region of the base body 11 and generates carriers in that region. Therefore, for example, light of a shorter wavelength, such as ultraviolet (near ultraviolet) light or visible light near the ultraviolet region, generates carriers within a shallow region near the surface of the base body 11. Although some of these carriers move toward the n-type semiconductor regions 121 due to free diffusion, most of them will eventually reach the surface of the base body 11 (the interface with the insulating film 16) and be lost. Therefore, the probability that the carriers generated in response to the light of shorter wavelengths reach the n-type semiconductor regions 121 and become reflected in the photocurrent is dramatically lower than the probability that the carriers generated in response to the light of longer wavelengths reach the n-type semiconductor regions 121 and become reflected in the photocurrent. As a result, the photo-detection sensitivity of the photodetector of the present embodiment to the light of shorter wavelengths is dramatically lower than its photo-detection sensitivity to the light of longer wavelengths. Thus, an effect which is practically the same as the removal of light at shorter wavelengths by an optical filter can be obtained. Generally, the photo-detection sensitivity to the light of 400-450 nm or shorter wavelengths can be dramatically lowered depending on the impurity concentration, DC reverse-bias voltage and other factors. The photodiode structure of the present embodiment also reduces the voltage-dependency of the junction capacitance.

Thus, in the photodiode in the present embodiment, the level of noise which depends on the junction capacitance can be reduced without significantly lowering the photo-detection sensitivity, as compared to the conventionally and commonly used photodiode in which the n-type semiconductor region is formed over the entire light-receiving area 10. The photo-detection sensitivity to longer wavelengths of light can be relatively improved by lowering the photo-detection sensitivity to shorter wavelengths of light. These features make the photodiode in the present embodiment particularly useful in the case where the target signal generated by visible light or near-infrared light needs to be detected with high sensitivity under a high amount of ultraviolet light present as a noise component.

Variation of First Embodiment

In the photodiode of the first embodiment, a number of n-type semiconductor regions 121 having a square shape as viewed from above are provided within one light-receiving area 10. The shape of the individual n-type semiconductor regions 121 as viewed from above is not limited to the square. For example, it may be an elongated rectangular shape, circular shape or polygonal shape. However, as can be understood from equation (1), decreasing the area of the n-type semiconductor region does not always lower the junction capacitance if the circumferential length of the region increases. Therefore, it is essential to strike the balance between the area and circumferential length of the individual n-type semiconductor regions so that the junction capacitance will be lowered. The number of n-type semiconductor regions arranged within the light-receiving area 10, i.e. the distribution density, also needs to be similarly controlled.

Figure 4:
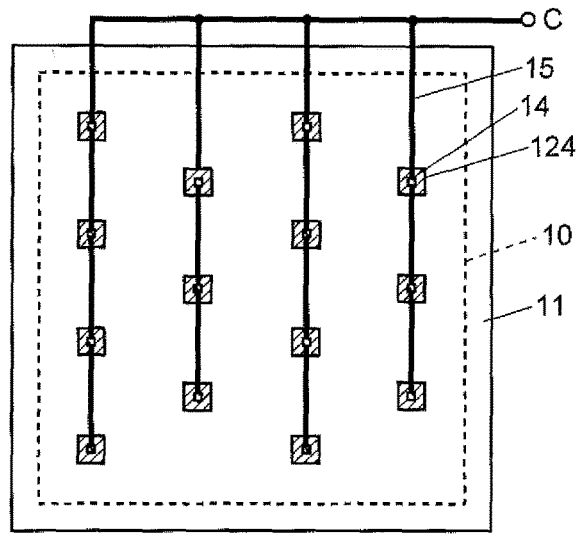
FIG. 4 is a top-side plan view of a photodiode as one variation.

FIG. 4 is a variation in which the n-type semiconductor regions 124 having a substantially square shape similar to the first embodiment are arranged in such a manner that the arrangement position of the n-type semiconductor regions 124 in every other column is shifted by approximately L/2. Shifting the arrangement of the n-type semiconductor regions 124 as shown in FIG. 4 has the following advantage.

In the case of the n-type semiconductor regions 121 arranged as shown in FIG. 1B, the point located in the middle of the four n-type semiconductor regions 121 neighboring each other in the longitudinal and lateral directions is the farthest point from the four n-type semiconductor regions 121. The distance to that point is approximately 0.7 L. By comparison, in the case of the n-type semiconductor regions 124 arranged as shown in FIG. 4, the spacing (lateral distance) of the columns can be greater than L under the condition that one n-type semiconductor region 124 is located at a distance equal to or smaller than 0.7 L from any point within the area surrounded by the three neighboring n-type semiconductor regions 124. Therefore, as compared to the arrangement shown in FIG. 1B, the present arrangement requires a smaller number of n-type semiconductor regions in order to cover the light-receiving area 10 so that carriers can be collected from the entire light-receiving area 10. Consequently, the junction capacitance will be even further lowered. The present arrangement also allows the spacing of the wire parts 15 to be increased so as to decrease the percentage of the light blocked by the wire part 15 and thereby increase the photo-detection signal.

In the photodiode of the first embodiment, the contact part 14 covers the almost entire area above the micro-sized n-type semiconductor region 121 created by diffusion. It is also possible to reduce the width of the wire part 15 so as to cover only a portion of the n-type semiconductor region 121, although this structure reduces the effect of lowering the photo-detection sensitivity to shorter wavelengths of light.

Figure 5A:
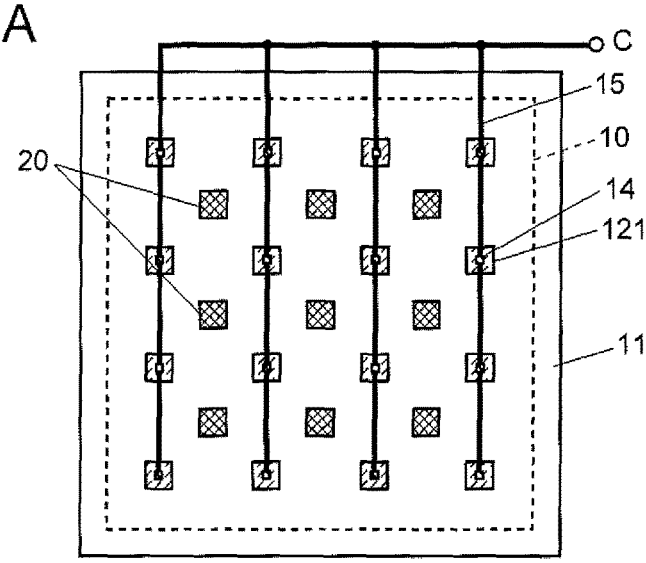
FIGS. 5A and 5B are respectively a top-side plan view and schematic sectional view of a photodiode as another variation.
Figure 5B:
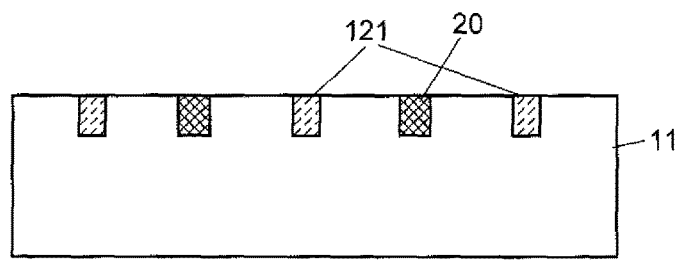

In the photodiode of the first embodiment, the p-type semiconductor region, which occupies the largest portion of the light-receiving area 10, has a substantially uniform impurity concentration. However, based on the fact that the potential gradient in the p-type semiconductor region is dependent on the impurity-concentration gradient, an impurity-concentration gradient may be created within the p-type semiconductor region in order to efficiently transfer the carriers generated in the p-type semiconductor region to the n-type semiconductor region 121. To this end, for example, as shown in FIG. 5, a high-concentration p-type diffusion region 20 created by diffusing a high-concentration p-type impurity in the form of a dot may be provided within an area outside the depletion-layer regions between the neighboring n-type semiconductor regions 121 and at approximately equal distances from the surrounding n-type semiconductor regions 121. This creates an impurity-concentration gradient from an area near this high-concentration p-type diffusion region 20 toward the n-type semiconductor region 121, whereby a gentle potential gradient is formed. This promotes the transfer of the carriers generated in the p-type base body 11 and thereby improves the photo-sensitivity and operation speed.

Figure 7:
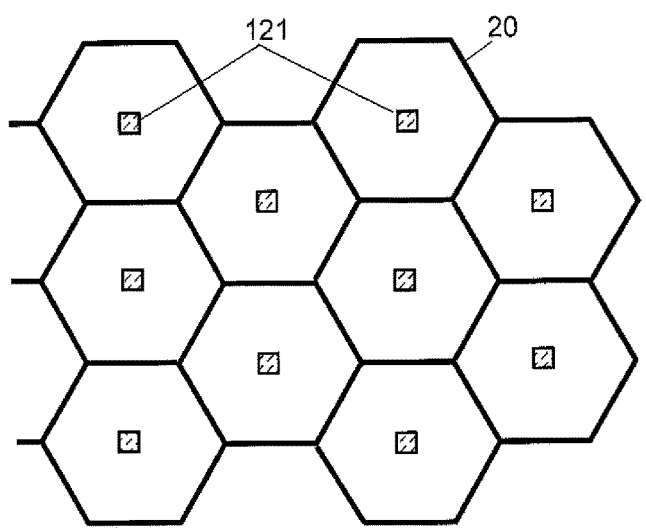
FIG. 7 is a top-side plan view of a photodiode as still another variation.

The high-concentration p-type diffusion regions 20 do not need to be shaped like dots but may have any other shape, such as a linear shape. FIG. 7 shows one example, in which the high-concentration p-type diffusion regions 20 are shaped like a substantially hexagonal wire (honeycomb shape) as viewed from above, with the n-type semiconductor region 121 located near the center of each high-concentration p-type diffusion region 20. This configuration creates an impurity-concentration gradient which surrounds each n-type semiconductor region 121 and slopes from all directions toward the n-type semiconductor region 121. Consequently, a gentle potential gradient is formed for each n-type semiconductor region 121 from the entire area around this region 121 toward the same region, so that the carriers will be more efficiently and quickly collected into the n-type semiconductor region 121.

Figure 6:
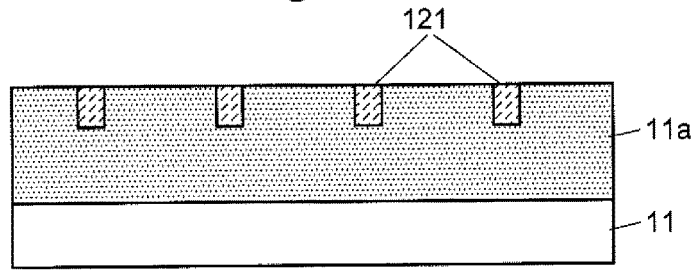
FIG. 6 is a schematic sectional view of a photodiode as still another variation.

In the examples of FIGS. 5 and 7, the potential gradient for promoting the carrier transfer is formed in the horizontal (lateral) direction. It is also possible to form a potential gradient in the vertical (thickness) direction. FIG. 6 is a schematic sectional view showing such an example. In this example, the upper surface of the base body 11 made of a p-type semiconductor having a relatively high impurity concentration is covered with a low-concentration p-type layer 11a having the same conductivity type (in the present case, p-type) yet with a relatively low impurity concentration. The n-type semiconductor regions 121 are created in the near-surface area of this low-concentration p-type layer 11a. In this configuration, the impurity-concentration gradient is formed upward from the base body 11, i.e. toward the n-type semiconductor regions 121. Accordingly, when a reverse-bias voltage is applied from the base body 11, a gentle potential gradient for promoting the upward transfer of the carriers is formed.

Needless to say, it is possible to jointly use both the horizontal impurity-concentration gradient and the vertical impurity concentration gradient.

Figure 8:
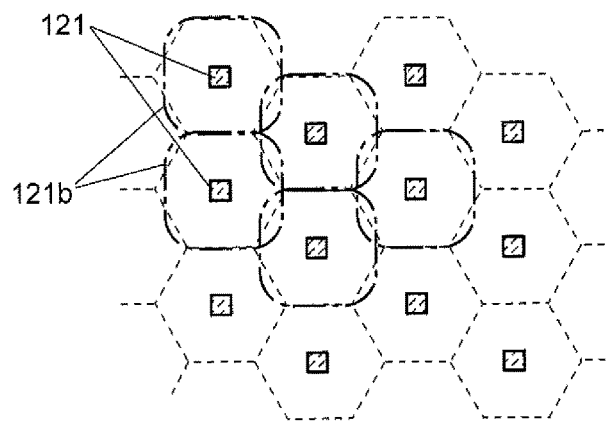
FIG. 8 is a top-side plan view of a photodiode as still another variation.

In the first embodiment and its variations described thus far, not only the carriers generated within the depletion-layer regions around the n-type semiconductor regions 121, but also the carriers generated outside those areas and transferred to the n-type semiconductor regions 121 by diffusion, are used as the photocurrent. However, for an application which particularly requires a high-speed response, it may be preferable to use only the carriers generated within the depletion-layer regions as the photocurrent. To this end, the spacing of the neighboring n-type semiconductor regions 121 should be determined so that the depletion-layer regions around the neighboring n-type semiconductor regions 121 have their edge portions maximally overlap each other. However, as explained earlier, in order to decrease the sum of the junction capacitances, the spacing of the n-type semiconductor regions 121 should preferably be widened to decrease the distribution density of the n-type semiconductor regions 121. In order to arrange the n-type semiconductor regions 121 with no gap between the neighboring depletion-layer regions while suppressing the sum of the junction capacitances to the lowest possible level, an arrangement as is shown in FIG. 8 may be adopted, in which the n-type semiconductor regions 121 are arranged in a honeycomb pattern, with each region given a peripheral region having a roughly hexagonal shape of a predetermined size as viewed from above. The areas denoted by numerals 121b in FIG. 8 are the depletion-layer regions formed around the n-type semiconductor regions 121. Such an arrangement of the n-type semiconductor regions 121 makes it possible to eliminate the gap between the neighboring depletion-layer regions 121b while maximally avoiding an unnecessary overlap of the depletion-layer regions 121b.

Under the condition that the total number of the n-type semiconductor regions 121 arranged within the light-receiving area 10 is the same, if the n-type semiconductor regions 121 are arranged in the previously described manner to eliminate the gap between the depletion-layer regions 121b, the light-receiving area 10 becomes naturally small. However, for example, in the case where the incident light reaches a large area, the light-receiving area 10 should preferably have a large area to efficiently receive the incident light. Even in the case where the incident light only reaches a small area, if the position of this area may widely change within a certain range, the light-receiving area 10 should also preferably have a large area to assuredly receive the incident light. Accordingly, a configuration as shown in FIG. 9 may be adopted to achieve both a large size of the light-receiving area 10 and a high-speed response.

In this photodiode, instead of decreasing the spacing of the n-type semiconductor regions to eliminate the gap between the depletion-layer regions, a light-blocking part 50 for preventing incident light from reaching the base body (p-type semiconductor region) 11 is provided almost over the entire area outside the depletion-layer regions 121b surrounding the n-type semiconductor regions 121 which are spaced to a certain extent so as to prevent the overlap of their depletion-layer regions. For example, the light-blocking part 50 can be created using a metal (or similar material) used for the wire part. Although the light-receiving area 10 is large, carriers are barely generated outside the depletion-layer regions 121b, i.e. within the region where the carriers are transferred by diffusion, since the light which reaches the area other than the depletion-layer region 121b around each n-type semiconductor region 121 is blocked by the light-blocking part 50. Therefore, most of the carriers generated by the incident light are quickly transferred to the n-type semiconductor regions 121 by drift and reflected in the photocurrent. Thus, the high-speed response is achieved. Meanwhile, since the area of the light-receiving area 10 itself is large (although the regions beneath the light-blocking part 50 do not effectively contribute to the detection of light), it can efficiently receive incident light which reaches a large area, as well as detect incident light hitting any portion of the large light-receiving area 10. If the light-receiving area 10 has a small area, it may be necessary to accurately adjust the optical axis so that the incident light will assuredly strike the light-receiving area. Using a light-receiving area 10 having a large area as in the present example is advantageous in that the incident light can be assuredly detected even when the optical axis is not adjusted with high accuracy (in some cases, even when no optical-axis adjustment is performed).

Figure 10A:
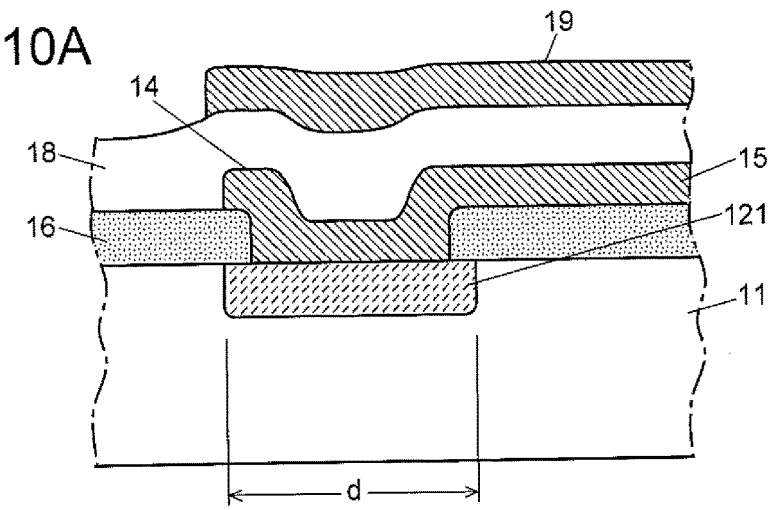
FIGS. 10A and 10B are respectively an enlarged sectional view and schematic sectional view of a variation in which a shielding wire part is added.
Figure 10B:
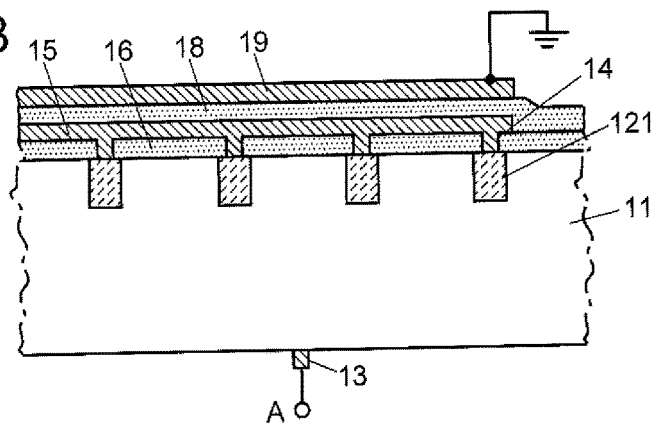
Figure 11:
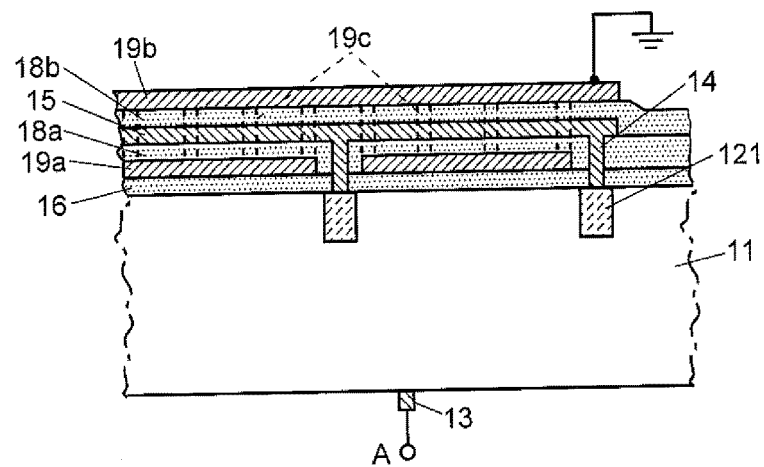
FIG. 11 is a schematic sectional view of another variation in which a shielding wire part is added.

As compared to the conventional photodiode, the photodiode of the first embodiment inevitably requires a larger number of wire parts 15 to be provided within the light-receiving area 10. If external noise enters the wire parts 15, the noise will appear in the photocurrent. To reduce the amount of external noise that entered the wire parts 15, a shielding wire part may additionally be provided. FIGS. 10A, 10B and 11 are sectional views showing examples of the structure provided with such a shielding wire part.

In the example of FIGS. 10A and 10B, the wire part 15 which connects a plurality of n-type semiconductor regions 121 is formed on an insulating film (first insulating film) 16 formed on the surface of the base body 11. Additionally, a second insulating film 18 is formed so as to cover the insulating film 16 and the wire part 15. A shielding wire part 19 is formed on this second insulating film 18, and only within the area above the wire part 15 and the contact part 14. The shielding wire part 19 is extended to the outside of the light-receiving area 10 and connected, for example, to a feeder line having a fixed electric potential (e.g. ground potential). This shielding wire part 19 catches most of the noise which would enter the wire part 15 if the shielding wire part 19 were not present. Consequently, the amount of noise that entered the wire part 15 in the lower layer is reduced.

In the example of FIG. 11, a lower-layer-shielding wire part 19a is formed on an insulating film (first insulating film) 16 formed on the surface of the base body 11, and only within the area below the wire part 15 (which will be described later). A second insulating film 18a is formed so as to cover the lower-layer-shielding wire part 19a. The wire part 15 which connects a plurality of n-type semiconductor regions 121 is formed on this second insulating film 18a. A third insulating film 18b is provided so as to cover the second insulating film 18a and the wire part 15. An upper-layer-shielding wire part 19b is formed on this third insulating film 18b, and only within the area above the wire part 15 and the contact part 14. The lower-layer-shielding wire part 19a and the upper-layer-shielding wire part 19b are connected to each other through a plurality of vias 19c which vertically penetrate the second and third insulating films 18a and 18b, and which are arrayed along the extending direction of the wire part 15 on both sides of this part.

The vias 19c serve to secure electrical conduction between the lower-layer-shielding wire part 19a and the upper-layer-shielding wire part 19b; they are not electrically connected to the wire part 15. Either the lower-layer-shielding wire part 19a or the upper-layer-shielding wire part 19b is extended to the outside of the light-receiving area 10 and connected, for example, to a feeder line having a fixed electric potential (e.g. ground potential). Accordingly, both the lower-layer-shielding wire part 19a and the upper-layer-shielding wire part 19b connected through the vias 19c, as well as the vias 19 themselves, are at the same electric potential. In the present configuration, the wire part 15 is vertically sandwiched between the lower-layer-shielding wire part 19a and the upper-layer-shielding wire part 19b, and is also surrounded by the vias 19c on its lateral sides. Such a configuration even further reduces the amount of external noise that entered the wire part 15 as compared to the configuration shown in FIGS. 10A and 10B.

In the example shown in FIG. 11, the lower-layer-shielding wire part 19a is provided below the wire part 15. However, the shielding effect barely changes if this lower-layer-shielding wire part 19a is not present, because, in many cases, the base body 11 is at the ground potential, and therefore, the electric potential in the area below the wire part 15 is practically at a fixed potential even if the lower-layer-shielding wire part 19a is not present. In the case of omitting the lower-layer-shielding wire part 19a, the vias 19c may be created in the form of pillar-shaped parts with only their upper ends connected to the upper-layer-shielding wire part 19b, or the lower ends of the vias 19c may be connected to the base body 11 (in which case a high-concentration p-region should preferably be formed at the contact portions on the base body 11) so that the base body 11, vias 19c and upper-layer-shielding wire part 19b will be at the ground potential.

In place of the pillar-shaped vias 19c surrounding the wire part 15 on both sides, side-shielding wire parts which extend substantially parallel to the wire part 15 may be provided so as to protect the same wire part 15 from both sides, with the side-shielding wire parts given the same electric potential as the lower-layer-shielding wire part 19a and the upper-layer-shielding wire part 19b.

The first embodiment is an example in which the photoelectric conversion element according to the present invention is applied in a silicon photodiode. The present invention can be applied in various elements which perform photoelectric conversion.

Second Embodiment

Figure 12A:
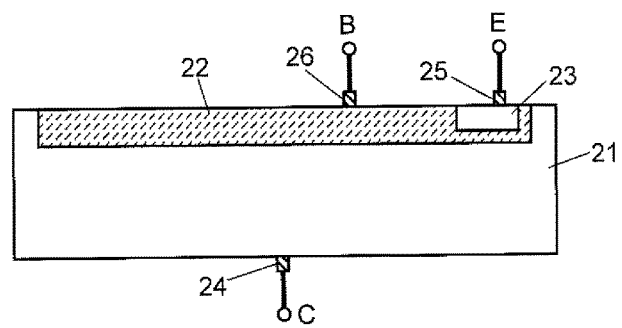
FIG. 12A is a schematic sectional view of a conventionally and commonly used phototransistor.
Figure 12B:
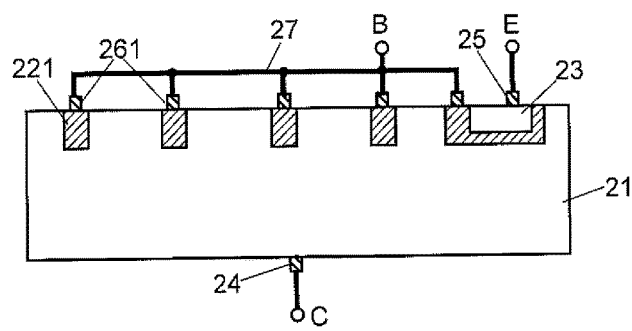
FIG. 12B is a schematic sectional view of a phototransistor as one embodiment of the photoelectric conversion element according to the present invention.

FIG. 12A is a schematic sectional view of a conventionally and commonly used phototransistor, and FIG. 12B is a schematic sectional view of a phototransistor as one embodiment of the present invention. In the present example, the base body 21 made of a p-type semiconductor is the collector region, the n-type semiconductor region 22 (or 221) created by diffusion on the surface of the base body 11 is the base region, the p-type semiconductor region 23 created by diffusion in the n-type semiconductor region 22 (or 221) is the emitter region, and the junction between the collector region and the base region is the photoelectric conversion region. The contact part 24 formed in contact with the base body 21 serves as the collector terminal (C), the contact part 26 (or 261) formed in contact with the n-type semiconductor region 22 (or 221) serves as the base terminal (B), and the contact part 25 formed in contact with the p-type semiconductor region 23 serves as the emitter terminal (E).

As shown in FIG. 12B, the phototransistor of the present embodiment has a plurality of micro-sized n-type semiconductor regions 221, with the contact parts 261 formed in contact with the respective n-type semiconductor regions 221 and connected to each other by the wire part 27. This structure, similar to FIG. 1C, is equivalent to a circuit having a plurality of junctions of the collector and base regions connected in parallel. Similarly to the photodiode in the first embodiment, the present structure allows the size and spacing of the n-type semiconductor regions 221 to be appropriately determined so as to decrease the junction capacitance of the p-n junctions to a lower level than in the conventional case and thereby reduce the noise level without substantially deteriorating the photo-detection sensitivity. Furthermore, the photo-detection sensitivity to shorter wavelengths of light can be dramatically lowered by providing the contact part connected to the n-type semiconductor region 221 serving as the base region in such a manner that the entire area above the n-type semiconductor region 221 is covered by the contact part.

Figure 13:
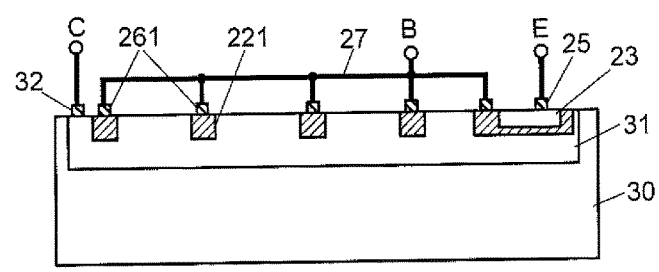
FIG. 13 is a schematic sectional view of a phototransistor on an integrated circuit as one embodiment of the photoelectric conversion element according to the present invention.

In the phototransistor of the second embodiment, the base body 21 itself serves as the collector region. In the case of using the phototransistor as one of the elements in an integrated circuit, the configuration can be modified as shown in FIG. 13, in which a well 31 made of a p-type semiconductor created in the base body 30 serves as the collector region, and a plurality of n-type semiconductor regions 221 are provided within this well 31 in a similar manner to FIG. 12B.

Third Embodiment

Figure 14:
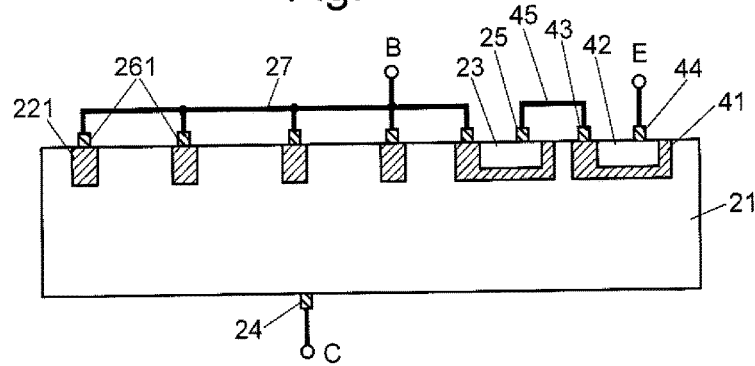
FIG. 14 is a schematic sectional view of a photodarlington transistor as one embodiment of the photoelectric conversion element according to the present invention.
Figure 15A:
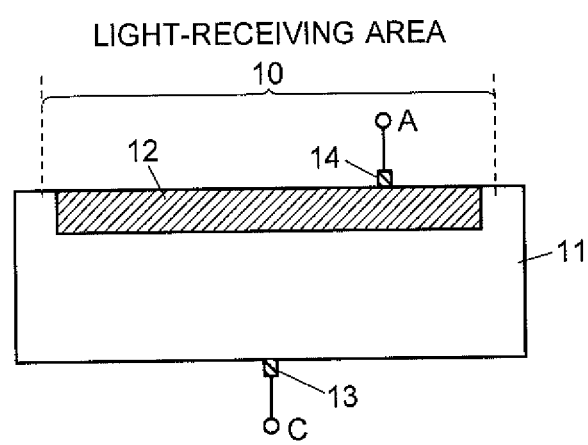
FIGS. 15A and 15B are respectively a schematic sectional view and top-side plan view of a conventionally and commonly used phototransistor.
Figure 15B:
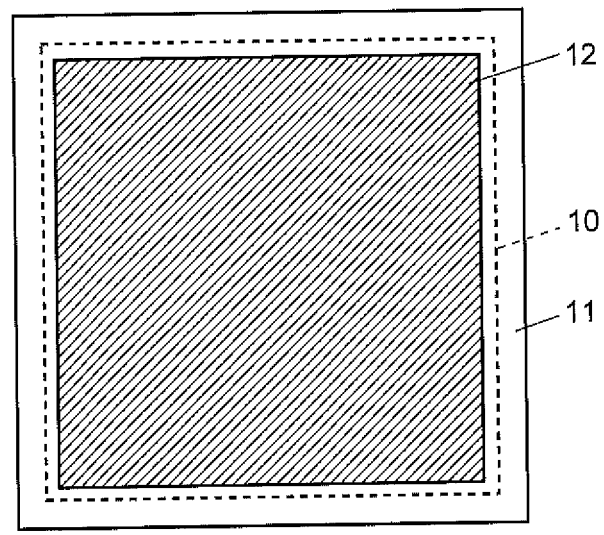

FIG. 14 is a schematic sectional view of a photodarlington transistor as one embodiment of the present invention. In the present photodarlington transistor, the contact part 25 formed in contact with the p-type semiconductor region 23 serving as the emitter region of the first transistor is connected, by a wire part 45, with the contact part 45 formed in contact with the n-type semiconductor region 41 serving as the base region of the second transistor. A p-type semiconductor region 42 which serves as the emitter region of the second transistor is created in this n-type semiconductor region 41. The contact part 44 formed in contact with this p-type semiconductor region 42 serves as the emitter terminal. The other basic structures are basically the same as the phototransistor shown in FIG. 12B.

As a matter of course, the photoelectric conversion element according to the present invention can also be used in such devices as a phototransistor incorporated in a photocoupler. Some photocouplers have a triac output or thyristor output for the control of an AC load or for other purposes. It is evident that the present invention can also be applied in a phototriac or photothyristor used in such an element.

It should be noted that any of the previously described embodiments is a mere example of the present invention, and any change, modification or addition appropriately made within the spirit of the present invention will evidently fall within the scope of claims of the present application.

REFERENCE SIGNS LIST

10 . . . Light-Receiving Area
11, 21, 30 . . . Base Body
121, 121a, 122, 123, 124, 221, 41 . . . N-Type Semiconductor Region
13, 14, 24, 25, 261, 43, 44 . . . Contact Part
15, 27, 45 . . . Wire Part
16, 18, 18a, 18b . . . Insulating Film
17 . . . Contact Hole
19, 19a, 19b . . . Shielding Wire Part
19c . . . Via
20 . . . High-Concentration P-Type Diffusion Region
23, 42 . . . P-Type Semiconductor Region
31 . . . Well
50 . . . Light-Blocking Part

The invention claimed is:

1. A photoelectric conversion element, comprising:
   a) a first region of a first conductivity type, the first region being either a semiconductor base body itself or a region which is formed in the semiconductor base body and is different from the semiconductor base body;
   b) a point-like second region of a second conductivity type different from the first conductivity type, the point-like second region formed by diffusing an impurity or growing an epitaxial layer on a surface of the first region within a light-receiving range;
   c) a light-blocking part for blocking light incident on the point-like second region among light incident on the light-receiving range on an entrance surface which receives light from outside; and
   d) a wire part including a first branch and a second branch arranged in parallel with each other within the light-receiving range,
   wherein the point-like second region produces a photo-detection signal by collecting, from a surrounding area, carriers generated in the first region by the light incident on the light-receiving range,
   wherein a plurality of the point-like second regions are arranged in a mutually separated form within the light-receiving range for obtaining a single photo-detection signal, with the plurality of point-like second regions mutually connected so as to total photo-detection signals produced by the individual point-like second regions, and
   wherein the wire part connects the plurality of the point-like second regions via the first branch and the second branch.

2. The photoelectric conversion element according to claim 1, wherein a total area of the plurality of the point-like second regions arranged within the light-receiving range is equal to or lower than 5% of an area of the light-receiving range.

3. The photoelectric conversion element according to claim 1, further comprising:
a plurality of contact parts respectively provided above the plurality of the point-like second regions, with each contact part electrically connected to the point-like second region located below,
wherein the wire part is an electric conductor for connecting the plurality of contact parts with each other, and
wherein all of the point-like second regions within the light-receiving range are located directly below either the contact parts and/or the wire part so as to make the contact parts and/or the wire part function as the light-blocking part.

4. The photoelectric conversion element according to claim 1, wherein a number of the point-like second regions as well as an area and circumferential length of each point-like second region are determined so that a sum of junction capacitances of junctions between the first region and the plurality of the point-like second regions becomes smaller than a junction capacitance which will be observed at the junction between the first region and the point-like second region if the point-like second region is formed over an entire light-receiving range.

5. The photoelectric conversion element according to claim 1, wherein the plurality of the point-like second regions are formed in a form of dots arranged rows or columns as viewed from above, and a position of the point-like second regions in every other row or column is shifted by one half of a spacing of the point-like second regions along an extending direction of the row or column.

6. The photoelectric conversion element according to claim 1, wherein the plurality of the point-like second regions are arranged so that depletion-layer-spread regions formed around the respective point-like second regions overlap each other without leaving any gap.

7. The photoelectric conversion element according to claim 1, wherein the plurality of the point-like second regions are arranged separately from each other so as to avoid overlapping of depletion-layer-spread regions formed in the first region around the respective point-like second regions, and the light-blocking part is provided over a portion or an entirety of an area outside the depletion-layer-spread region around each point-like second region within a light-receiving range.

8. The photoelectric conversion element according to claim 1, wherein a high-concentration region having a predetermined shape as viewed from above is formed between the plurality of the point-like second regions discretely arranged in the first region, the high-concentration region having a higher concentration of the impurity of the first conductivity type than the surrounding first region.

9. The photoelectric conversion element according to claim 3, wherein the wire part located above a depletion-layer-spread region formed in the first region surrounding the point-like second region has a smaller linewidth than the contact part and the wire part located above the point-like second region.

10. The photoelectric conversion element according to claim 3, further comprising:
an insulating film formed so as to cover the contact part and the wire part; and
a conductor part provided on the insulating film above the contact part and the wire part,
wherein a predetermined fixed electric potential is given to the conductor part so as to make the conductor part function as an electric shield.

11. The photoelectric conversion element according to claim 10, wherein a plurality of conductive pillar-shaped parts extending from the conductor part located above the wire part into the insulating film sandwiched between the conductor part and the wire part are formed in such a manner as to surround lateral sides of the wire part, or conductive linear parts extending substantially parallel to the wire part are formed in such a manner as to protect the wire part from both sides, and the pillar-shaped parts or the linear parts are made to function as an electric shield in conjunction with the conductor part.

12. A photoelectric conversion element, comprising:
a) a first region of a first conductivity type, the first region being either a semiconductor base body itself or a region which is formed in the semiconductor base body and is different from the semiconductor base body; and
b) a plurality of the point-like second regions of a second conductivity type different from the first conductivity type arranged in a mutually separated form within a light-receiving range for obtaining a single photodetection signal, with the plurality of the point-like second regions mutually connected so as to total photodetection signals produced by the individual point-like second regions, the point-like second region formed by diffusing an impurity or growing an epitaxial layer on a surface of the first region within the light-receiving range,
where the point-like second region produces a photodetection signal by collecting, from a surrounding area, carriers generated in the first region by the light incident on the light-receiving range, and
wherein the point-like second region is a region whose area is equal to or smaller than 1% of the entire light-receiving range.

13. The photoelectric conversion element according to claim 12, wherein a total area of the plurality of the point-like second regions arranged within the light-receiving range is equal to or lower than 5% of an area of the light-receiving range.

14. The photoelectric conversion element according to claim 12, wherein a number of the point-like second regions as well as an area and circumferential length of each point-like second region are determined so that a sum of junction capacitances of junctions between the first region and the plurality of the point-like second regions becomes smaller than a junction capacitance which will be observed at the junction between the first region and the point-like second region if the point-like second region is formed over an entire light-receiving range.

15. The photoelectric conversion element according to claim 12, wherein the plurality of the point-like second regions are formed in a form of dots arranged rows or columns as viewed from above, and a position of the point-like second regions in every other row or column is shifted by one half of a spacing of the point-like second regions along an extending direction of the row or column.

16. The photoelectric conversion element according to claim 12, wherein the plurality of the point-like second regions are arranged so that depletion-layer-spread regions formed around the respective point-like second regions overlap each other without leaving any gap.

17. The photoelectric conversion element according to claim 12, wherein the plurality of the point-like second regions are arranged separately from each other so as to avoid overlapping of depletion-layer-spread regions formed in the first region around the respective point-like second regions, and a light-blocking part for blocking an incidence of light is provided over a portion or an entirety of an area outside the depletion-layer-spread region around each point-like second region within a light-receiving range.

18. The photoelectric conversion element according to claim 12, wherein a high-concentration region having a predetermined shape as viewed from above is formed between the plurality of the point-like second regions discretely arranged in the first region, the high-concentration region having a higher concentration of the impurity of the first conductivity type than the surrounding first region.

19. The photoelectric conversion element according to claim 12,
   wherein the point-like second region has a square shape, and
   wherein a spacing between neighboring ones of the point-like second regions is 5-20 μm.

* * * * *